United States Patent
Matsui et al.

(10) Patent No.: US 9,847,449 B2
(45) Date of Patent: Dec. 19, 2017

(54) NITRIDE SEMICONDUCTOR LIGHT-EMITTING DEVICE WITH PERIODIC GAIN ACTIVE LAYERS

(71) Applicants: MEIJO UNIVERSITY, Nagoya-shi, Aichi (JP); STANLEY ELECTRIC CO., LTD., Meguro-ku, Tokyo (JP)

(72) Inventors: Kenjo Matsui, Nagoya (JP); Tetsuya Takeuchi, Nagoya (JP); Motoaki Iwaya, Nagoya (JP); Isamu Akasaki, Nagoya (JP); Takanobu Akagi, Tokyo (JP); Sho Iwayama, Tokyo (JP)

(73) Assignees: MEIJO UNIVERSITY, Nagoya-Shi, Aichi (JP); STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/955,409

(22) Filed: Dec. 1, 2015

(65) Prior Publication Data

US 2016/0163919 A1    Jun. 9, 2016

(30) Foreign Application Priority Data

Dec. 4, 2014    (JP) .................................. 2014-245909

(51) Int. Cl.
*H01L 29/06*    (2006.01)
*H01L 31/00*    (2006.01)
(Continued)

(52) U.S. Cl.
CPC ............ *H01L 33/06* (2013.01); *H01L 33/105* (2013.01); *H01S 5/00* (2013.01)

(58) Field of Classification Search
CPC ....... H01L 33/06; H01L 33/32; H01L 33/105; H01S 5/34333; H01S 5/18358;
(Continued)

(56) References Cited

U.S. PATENT DOCUMENTS

| | | | | |
|---|---|---|---|---|
| 4,881,238 A | * | 11/1989 | Chinone | ................ B82Y 20/00 |
| | | | | 372/45.01 |
| 5,038,185 A | * | 8/1991 | Thornton | ................ H01S 5/026 |
| | | | | 257/12 |

(Continued)

FOREIGN PATENT DOCUMENTS

JP    2014-045015 A    3/2014

OTHER PUBLICATIONS

K. Matsui, K. Horikawa, Y. Kozuka, K. Ikeyama, D. Komori, T. Takeuchi, S. Kamiyama, M. Iwaya, and I. Akasaki; Optimization of Carrier Distributions in Periodic Gain Structures towards Blue VCSELs; Dec. 16, 2014; Journal: 2014 MRS Fall Meeting; Manuscript ID: MRSF14-1736-T04-08.R1.

*Primary Examiner* — Thao X Le
*Assistant Examiner* — Nduka Ojeh
(74) *Attorney, Agent, or Firm* — Smith, Gambrell & Russell, LLP

(57) ABSTRACT

A nitride semiconductor light-emitting device with periodic gain active layers includes an n-type semiconductor layer, a p-type semiconductor layer and a resonator. The device further includes a plurality of active layers disposed between the n-type and p-type semiconductor layers so as to correspond to a peak intensity position of light existing in the resonator and at least one interlayer disposed between the active layers. The active layer disposed at the p-type semiconductor layer side has a larger light emission intensity than the active layer disposed at the n-type semiconductor layer side.

6 Claims, 7 Drawing Sheets

(51) Int. Cl.
*H01L 33/06* (2010.01)
*H01L 33/10* (2010.01)
*H01S 5/00* (2006.01)

(58) Field of Classification Search
CPC .............. H01S 5/18383; H01S 5/3407; H01S 5/18308; H01S 5/3063; H01S 5/00; H01S 5/18
USPC .............. 257/E33.008, 14, 103, 13; 438/29; 372/45.01, 45.012, 45
See application file for complete search history.

(56) References Cited

U.S. PATENT DOCUMENTS

| | | | | |
|---|---|---|---|---|
| 2002/0053676 A1* | 5/2002 | Kozaki | ................ | B82Y 20/00 257/88 |
| 2006/0006375 A1* | 1/2006 | Ou | ................ | H01L 33/08 257/14 |
| 2006/0165143 A1* | 7/2006 | Ohno | ................ | B82Y 20/00 372/46.015 |
| 2008/0212631 A1* | 9/2008 | Takeuchi | ................ | B82Y 20/00 372/45.01 |
| 2009/0166668 A1* | 7/2009 | Shakuda | ................ | B82Y 20/00 257/103 |
| 2014/0126600 A1* | 5/2014 | Kawashima | ................ | H01S 5/18358 372/45.01 |

* cited by examiner

NITRIDE SEMICONDUCTOR LIGHT-EMITTING DEVICE WITH PERIODIC GAIN ACTIVE LAYERS

CROSS-REFERENCE TO RELATED APPLICATIONS

This application is based upon and claims the benefit of priority from the prior Japanese Patent Application No. 2014-245909 filed on Dec. 4, 2014, the entire contents of which are incorporated herein by reference.

BACKGROUND

1. Technical Field

The present disclosure relates to a nitride semiconductor light-emitting device with periodic gain active layers.

2. Related Art

There have conventionally been provided nitride semiconductor light-emitting devices with periodic gain active layers. One of these conventional nitride semiconductor light-emitting devices includes a first active layer, a second active layer and an interlayer provided between the first and second active layers. In the device, furthermore, an amount of magnesium (Mg) as a p-type impurity doped into the interlayer is adjusted so that carriers (electrons and holes (positive holes)) are supplied to the first and second active layers in a balanced manner. Here, the first active layer serves as an active layer disposed at an n-type semiconductor layer side and the second active layer serves as an active layer disposed at a p-type semiconductor layer side. Thus, the above-described nitride semiconductor light-emitting device can actually increase thicknesses of the active layers as compared with a case where a single active layer is provided, with the result that the performance of the device can be improved.

In the above-described conventional nitride semiconductor light-emitting device, however, crystal qualities of the active layers are reduced as Mg as the p-type impurity is doped into the interlayer. As a result, there is a possibility that the performance of the nitride semiconductor light-emitting device would be reduced.

SUMMARY

Therefore, an object of the disclosure is to provide a nitride semiconductor light-emitting device with periodic gain active layers, which can desirably emit light.

The disclosure provides a nitride semiconductor light-emitting device with periodic gain active layers, which includes an n-type semiconductor layer, a p-type semiconductor layer and a resonator. The device further includes a plurality of active layers disposed between the n-type and p-type semiconductor layers so as to correspond to a peak intensity position of light existing in the resonator and at least one interlayer disposed between the active layers. The active layer disposed at the p-type semiconductor layer side has a larger light emission intensity than the active layer disposed at the n-type semiconductor layer side.

The disclosure also provides a nitride semiconductor light-emitting device with periodic gain active layers, which includes an n-type semiconductor layer, a p-type semiconductor layer and a resonator. The device further includes a plurality of active layers disposed between the n-type and p-type semiconductor layers so as to correspond to a peak intensity position of light existing in the resonator and at least one interlayer disposed between the active layers. An amount of positive holes and electrons injected into the active layer disposed at the p-type semiconductor layer side is larger than an amount of positive holes and electrons injected into the active layer disposed at the n-type semiconductor layer side.

In the first one of the above-described nitride semiconductor light-emitting devices, the active layer disposed at the p-type semiconductor layer side has a larger light emission intensity than the active layer disposed at the n-type semiconductor layer side. In the second nitride semiconductor light-emitting device, an amount of positive holes and electrons injected into the active layer disposed at the p-type semiconductor layer side is larger than an amount of positive holes and electrons injected into the active layer disposed at the n-type semiconductor layer side. In each nitride semiconductor light-emitting device, a concentration of Mg as the p-type impurity doped into the interlayer can be reduced to a low level. This can suppress a reduction in the crystal quality of the active layer disposed at the p-type semiconductor layer side and accordingly a reduction in the light emission intensity of the nitride semiconductor light-emitting device with the periodic gain active layers. Accordingly, the device can successfully emit light.

In each of the above-described devices, Mg as a p-type impurity doped into the interlayer may have a concentration of not more than $5\times10^{18}$ cm$^{-3}$. In this case, each device can suppress reduction in the light emission intensity relative to the current density.

In each one of the above-described devices, Mg as a p-type impurity doped into the active layer disposed at the p-type semiconductor layer side may have a concentration ranging from 0.2 times to twice as high as a concentration of Mg doped into the interlayer. In this case, positive holes can successfully be supplied to the active layer disposed at the n-type semiconductor layer side with the result of an increase in the light emission intensity of the active layer disposed at the n-type semiconductor layer side.

In each one of the above-described devices, two active layers may be provided and have respective light emission wavelengths equal to each other. In this case, the resonator in each device can successfully resonate by a gain of the active layer.

DETAILED DESCRIPTION

First and second embodiments will be described with reference to the drawings.

First Embodiment:

A nitride semiconductor light-emitting device with periodic gain active layers according to a first embodiment includes a first active layer (corresponding to an active layer disposed at an n-type semiconductor layer side) and a second active layer (corresponding to an active layer disposed at a p-type semiconductor layer side) into both of which carriers (electrons and holes (positive holes)) need to be injected evenly. In more detail, in order that carriers may evenly be injected into the first and second active layers, a suitable amount of p-type impurity needs to be doped into an interlayer provided between the first and second active layers thereby to enhance injection of holes into the first active layer. Holes have a lower mobility and a larger effective mass than electrons. Furthermore, the first active layer is disposed with the second active layer and the interlayer being interposed between the p-type semiconductor layer serving as a hole-supply source and the first active layer. In other words, the first active layer is located at a position remoter from the p-type semiconductor layer than the second active layer. Accordingly, an amount of holes injected into the first active layer is smaller than an amount of holes injected into the second active layer.

An experiment was conducted to examine light emission intensities of the first and second active layers, that is, the injection of carriers into the first and second active layers by intentionally changing light emission wavelengths of the first and second active layers in order to obtain optimal conditions under which carriers can be injected evenly into the first and second active layers.

Figure 1:
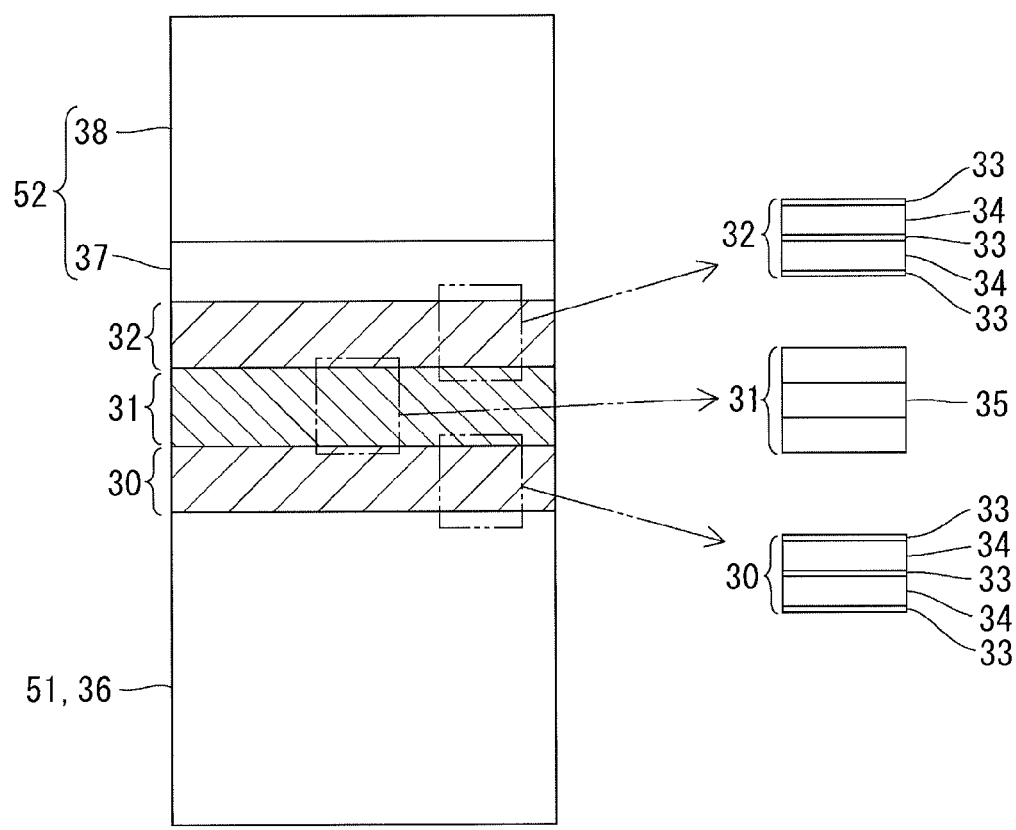
FIG. 1 is a schematic diagram showing layer structures of nitride semiconductor light-emitting devices with periodic gain active layers, of a first embodiment and comparative examples 1 to 4, respectively.

Nitride semiconductor light-emitting devices with periodic gain active layers, of the first embodiment and comparative examples 1 to 4 were prepared for the conduct of the experiment, respectively. The device of the first embodiment includes a first active layer 30, a second active layer 32 and an interlayer 31, as shown in FIG. 1.

The first active layer 30 has GaInN quantum well layers 33 each of which has a layer thickness of 2 nm and GaN barrier layers 34 each of which has a layer thickness of 10 nm. The first active layer 30 is formed into a triplex quantum well structure by stacking 2.5 pairs of the GaInN quantum well layers 33 and the GaN barrier layers 34. More specifically, the first active layer 30 is formed of three well layers and two barrier layers.

The second active layer 32 also has GaInN quantum well layers 33 each of which has a layer thickness of 2 nm and GaN barrier layers 34 each of which has a layer thickness of 10 nm. The second active layer 32 is formed into a triplex quantum well structure by stacking 2.5 pairs of the GaInN quantum well layers 33 and the GaN barrier layers 34. That is, the first and second active layers 30 and 32 have the same layer structure.

The interlayer 31 is formed between the first and second active layers 30 and 32 and has a layer thickness of 50 nm. As a result, the first and second active layers 30 and 32 have respective layer-thicknesswise centers which can be caused to correspond with a position of antinode of a standing wave formed by a laser operation in the resonator. Accordingly, the device of the first embodiment can obtain effects of a periodic gain structure. Furthermore, magnesium (Mg) serving as a p-type impurity is doped into a section 35 with a thickness of 20 nm about the layer-thicknesswise center.

The experiment, in which the light emission intensities of, namely, the injection of carriers into the first and second active layers 30 and 32 are examined, has a purpose of evaluating light emission intensities of the first and second active layers 30 and 32. Accordingly, the resonator structure by use of the reflecting mirrors is not necessary in the experiment including the first embodiment, although reflecting mirrors (not shown) are provided on a surface (an upper side in FIG. 1) and a rear surface (a lower side in FIG. 1) respectively in a nitride semiconductor light-emitting device performing a laser operation as in a second embodiment which will be described later, thereby forming a resonator structure.

Accordingly, in order that current injection may be realized, an n-GaN layer 36 is stacked on a rear surface of the first active layer 30 and a p-AlGaN layer 37 is stacked on a surface of the second active layer 32 in the device of the first embodiment. A p-GaN layer 38 is further stacked on a surface of the p-AlGaN layer 37.

The n-GaN layer 36 has a layer thickness of 2 μm and corresponds to an n-type semiconductor layer 51. More specifically, the first active layer 30 is disposed at the n-type semiconductor layer 51 side. The p-AlGaN layer 37 has a layer thickness of 20 nm and the p-GaN layer 38 has a layer thickness of 100 nm. The p-AlGaN layer 37 and the p-GaN layer 38 correspond to a p-type semiconductor layer 52. More specifically, the second active layer 32 is disposed at the p-type semiconductor layer 52 side. Furthermore, the nitride semiconductor light-emitting devices with the respective periodic gain active layers, of comparative examples 1 to 4 have the same layer structure as the device of the first embodiment.

In each one of the first embodiment and comparative examples 1 to 4, one of the first and second active layers 30 and 32 has a light emission wavelength set to 410 nm and the other has a light emission wavelength set to 450 nm, as shown in TABLE 1. Furthermore, the concentrations of Mg as the p-type impurity doped into the interlayers 31 are changed in the nitride semiconductor light-emitting devices of the first embodiment and comparative examples 1 to 4.

TABLE 1

| | First active layer emission wavelength [nm] | Second active layer emission wavelength [nm] | Interlayer Mg concentration [cm$^{-3}$] |
|---|---|---|---|
| Comparative Example 1 | 410 | 450 | 0 |
| First Embodiment | 410 | 450 | 5.5 × 10$^{18}$ |
| Comparative Example 2 | 410 | 450 | 8.0 × 10$^{18}$ |
| Comparative Example 3 | 450 | 410 | 0 |
| Comparative Example 4 | 450 | 410 | 7.0 × 10$^{18}$ |

Since the light emission wavelength of the first active layer 30 differs from the light emission wavelength of the second active layer 32, a band gap difference or a potential difference occurs between the first and second active layers 30 and 32. As a result, it should be noted that amounts of carriers injected into the respective active layers 30 and 32 are influenced by the potential difference.

In view of the foregoing, the light emission wavelengths of the first and second active layers 30 and 32 are set to 410 nm and 450 nm respectively in the first embodiment and comparative examples 1 and 2, whereas the light emission wavelengths of the first and second active layers 30 and 32 of comparative examples 3 and 4 are set to 450 nm and 410 nm in reverse respectively.

In the experiment, the nitride semiconductor light-emitting devices of the first embodiment and comparative examples 1 to 4 were fabricated by a metalorganic chemical vapor deposition (MOCVD). Furthermore, the devices included elements which had respective small element areas and were fabricated by photolithography so that a current density (~kA/cm$^2$) equivalent to that in the case where a surface-emitting laser was driven was obtained. Thus, light emission spectra and current-emission intensity characteristics were evaluated regarding the nitride semiconductor light-emitting devices of the first embodiment and comparative examples 1 to 4.

Figure 2A:
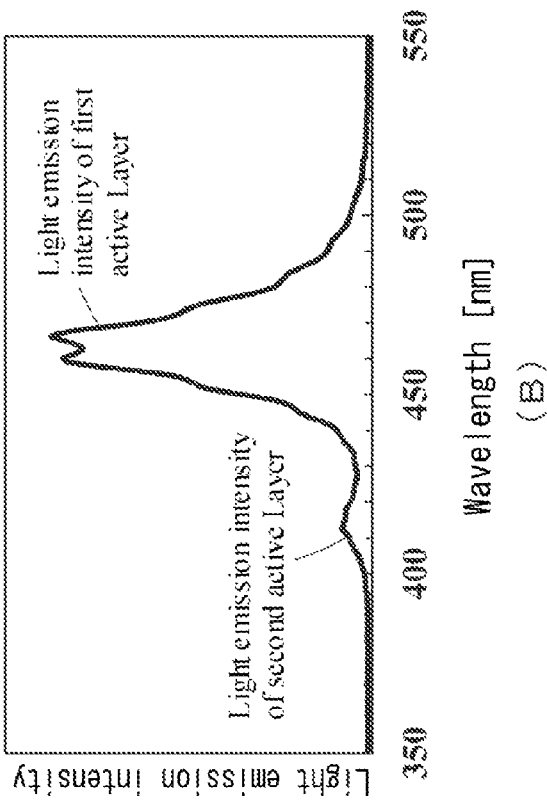
FIGS. 2(A) and 2(B) show (A) emission spectra by current injection in the first embodiment and (B) comparative example 4 respectively.
Figure 2B:
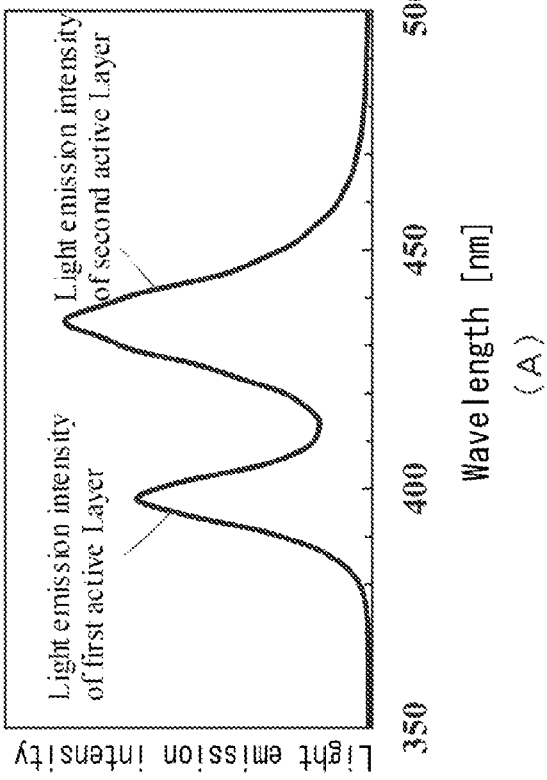

FIGS. 2(A) and 2(B) show light emission spectra by current injection regarding the first embodiment and comparative example 4 respectively. Light emission intensities substantially equal to each other were observed in the first and second active layers 30 and 32 of the device of the first embodiment respectively, as shown in FIG. 2(A). This indicates that carriers are successfully injected into the first and second active layers. Furthermore, the light emission intensity of the second active layer 32 is considerably smaller than the light emission intensity of the first active layer 30 regarding the nitride semiconductor light-emitting device of comparative example 4, as shown in FIG. 2(B). This indicates that an amount of carriers injected into the second active layer 32 is smaller than an amount of carriers injected into the second active layer 30 of comparative example 4.

A light emission intensity ratio of light emitted from the first and second active layers 30 and 32 is defined as follows:

Light emission intensity ratio=light emission intensity of the first active layer 30 (the n-type semiconductor 51 side)/light emission intensity of the first active layer 30 (the n-type semiconductor 51 side)+light emission intensity of the second active layer 32 (the p-type semiconductor 52 side).

The definition represents that light emission of the nitride semiconductor light-emitting device is all from the second active layer 32 (the p-type semiconductor 52 side) when the light emission intensity ratio is 0. The definition further represents that when the light emission intensity ratio is 0.5, light is evenly emitted from the first active layer 30 (the n-type semiconductor 51 side) and the second active layer 32 (the p-type semiconductor 52 side). The definition still further represents that when the light emission intensity ratio is 1, light emission of the device is all from the first active layer 30 (the n-type semiconductor 51 side).

Figure 3:
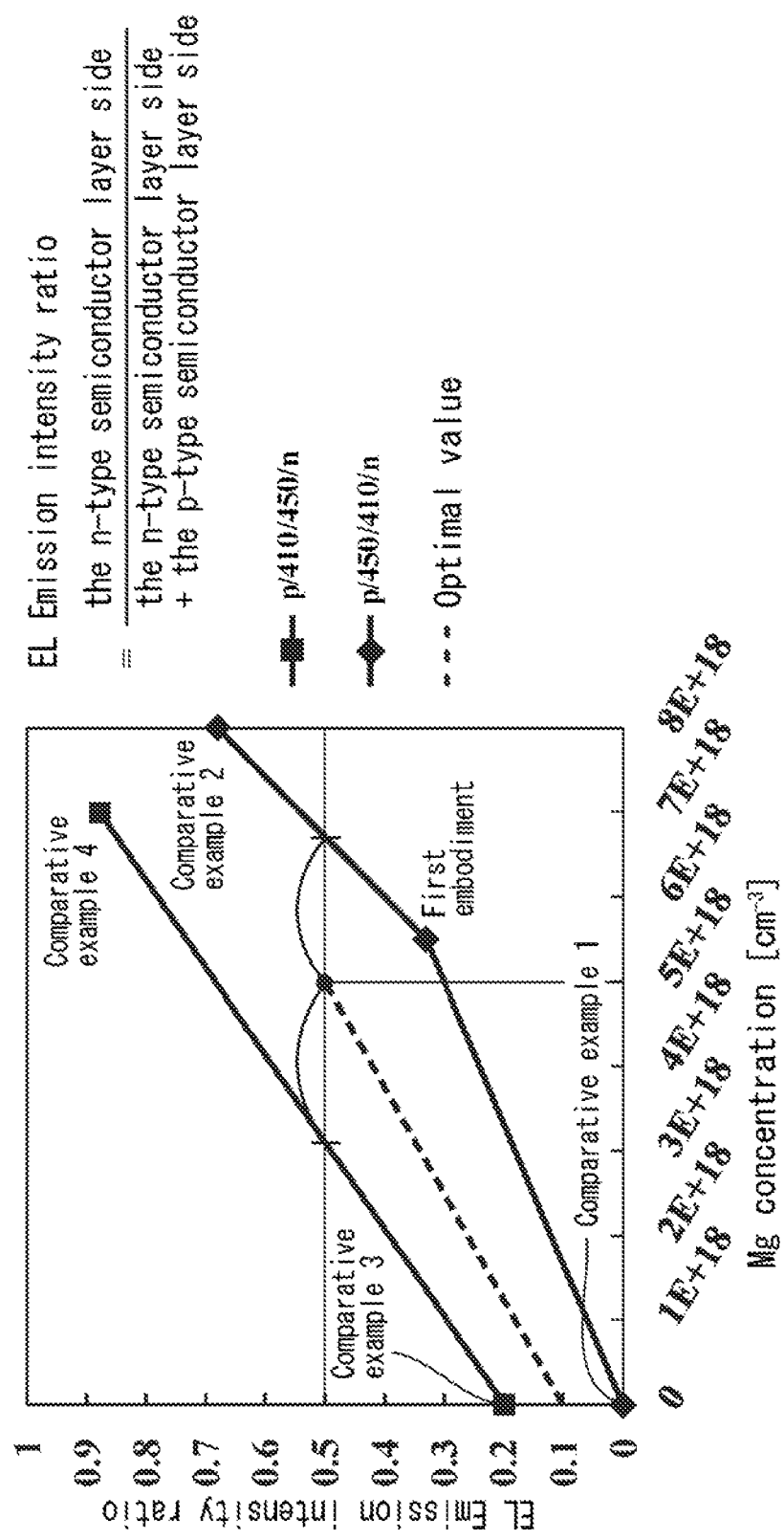
FIG. 3 is a graph showing measurement results of light emission intensity ratios of the first embodiment and comparative examples 1 to 4, the graph being plotted according to a doping concentration of Mg as a p-type impurity doped into the interlayer.

FIG. 3 shows measurement results of light emission intensity ratios of the first embodiment and comparative examples 1 to 4. The measurement results are plotted in accordance with the aforementioned definition and doping concentrations of magnesium (Mg) as a p-type impurity doped into the interlayer 31. The light emission intensity ratio is 0.5 when the light emission intensity of the first active layer 30 is equal to the light emission intensity of the second active layer 32. This indicates that carrier injection is evenly carried out in the first and second active layers 30 and 32 in principle.

The difference in the light emission wavelength between the first and second active layers 30 and 32 causes a band gap difference or a potential difference between the first and second active layers 30 and 32. In light of the fact that amounts of carriers injected into the respective first and second active layers 30 and 32 are influenced by the potential difference, the following comprehensive determination can be made from the measurement results of light emission intensity ratios of the comparative examples 3 and 4 to the first embodiment and comparative examples 1 and 2. That is, it is considered that a light emission intensity ratio of the device in which the first and second active layers 30 and 32 have the same light emission wavelength passes along a substantial middle between a line obtained by connecting points of the first embodiment and comparative examples 1 and 2 plotted on a graph of FIG. 3 and a line obtained by connecting points of comparative examples 3 and 4 plotted on the graph (a dotted line in FIG. 3). More specifically, it is considered that the device in which the first and second active layers 30 and 32 have the same light emission wavelength has a light emission intensity ratio which takes an average value of the measurement results of light emission intensity ratios of the first embodiment and the comparative examples 1 and 2 and the result of the comparative examples 3 and 4. Consequently, it is found that Mg as the p-type impurity doped into the interlayer 31 has a concentration of about $5 \times 10^{18}$ cm$^{-3}$, at which value carriers can evenly be injected into the first and second active layers 30 and 32 of the device in which the first and second active layers 30 and 32 have the same light emission wavelength.

Figure 4:
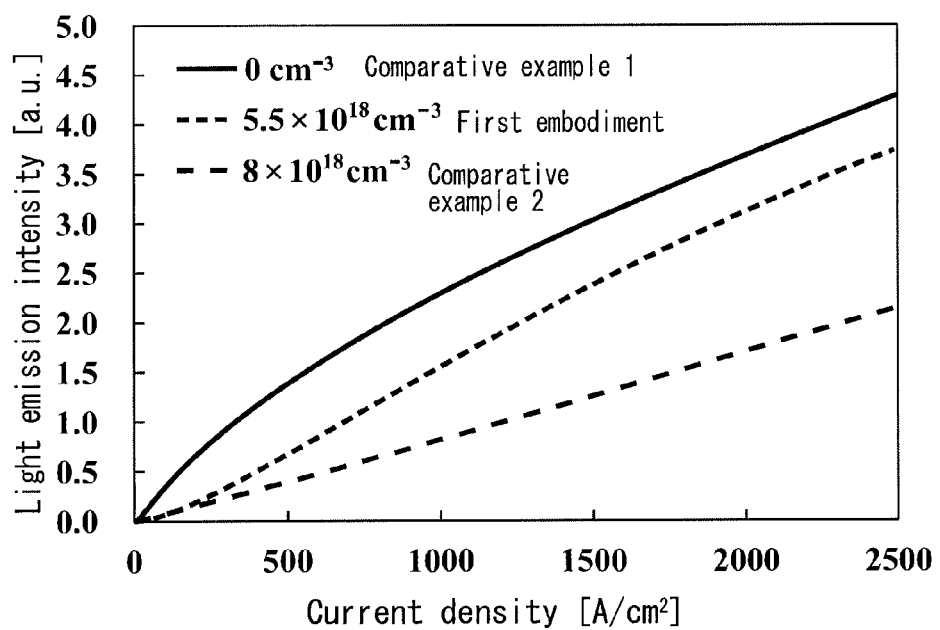
FIG. 4 is a graph showing the relationship between light emission intensity and the current density in the first embodiment and comparative examples 1 and 2.

FIG. 4 shows current-light emission intensity characteristics of the nitride semiconductor light-emitting devices of the first embodiment and comparative examples 1 and 2. A characteristic (solid line) of the nitride semiconductor light-emitting device of comparative example 1 is indicative of light emission only from the second active layer 32. This light emission intensity is comparable to those of conventional nitride semiconductor light-emitting devices with only one active layer although comparison is not shown. Furthermore, in each of the nitride semiconductor light-emitting devices of the first embodiment and comparative examples 1 and 2, the light emission intensity ratio is larger than 0 as the doping concentration of Mg as the p-type impurity doped into the interlayer 31 becomes high, as shown in FIG. 3. As shown in FIG. 4, however, a characteristic (a long dotted line) of comparative example 2 indicates that when the doping concentration of Mg is increased to $8 \times 10^{18}$ cm$^{-3}$, the light emission intensity is reduced to a large extent as compared with the characteristic (the solid line) of comparative example 1. This is considered to result from a phenomenon that a certain amount of Mg to be doped into only the interlayer 31 is unintentionally taken into the second active layer 32 by a memory effect of Mg (see FIG. 5). More specifically, when the doping concentration of Mg is increased, a large amount of Mg is unintentionally taken into the second active layer 32 by the memory effect thereof. As a result, the crystal quality of the second active layer 32 is reduced with the result that the light emission intensity of the second active layer is reduced.

Figure 5:
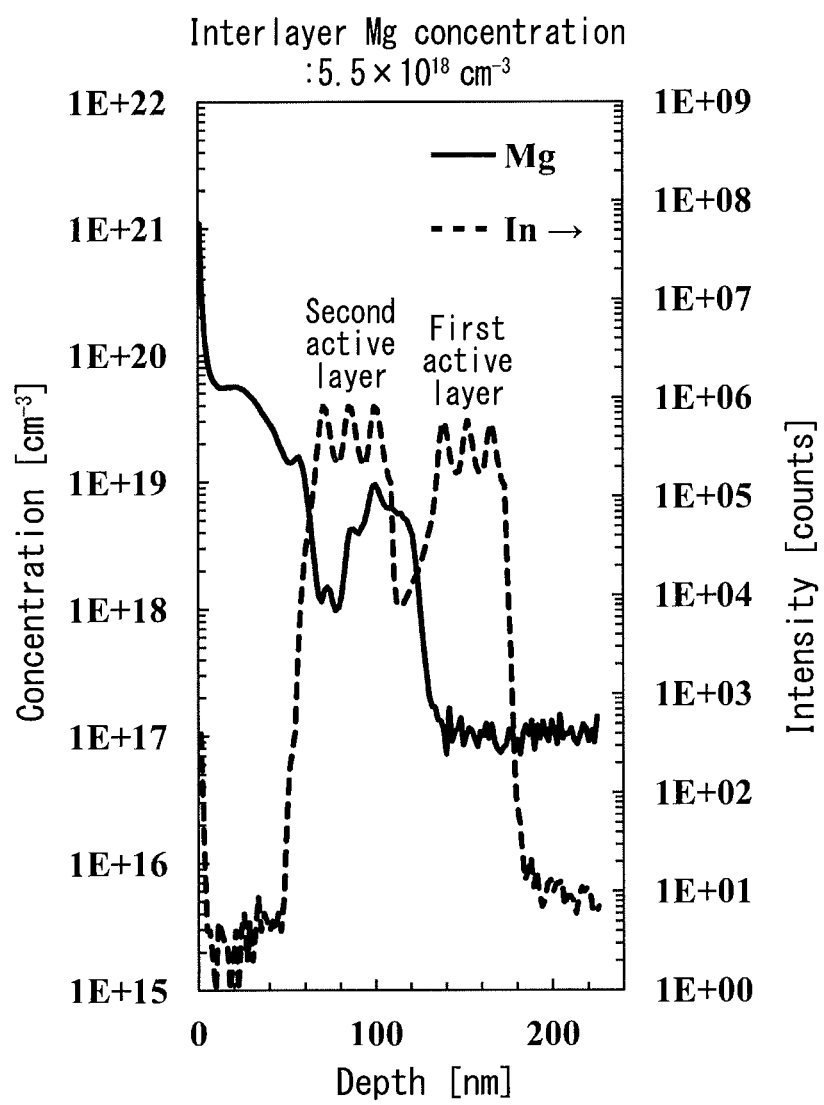
FIG. 5 is a graph showing concentration distribution of In and Mg in a depthwise direction from the surface of the nitride semiconductor light-emitting device of the first embodiment.
Figure 6:
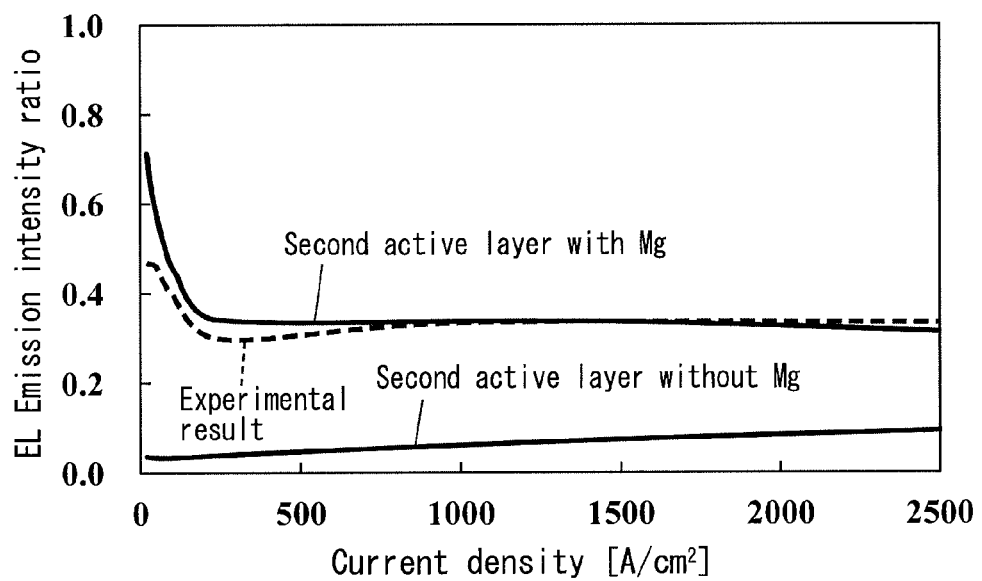
FIG. 6 is a graph showing the relationship between emission intensity ratio and current density when Mg is doped into the active layer disposed at the p-type semiconductor layer side and when Mg is undoped into the active layer disposed at the p-type semiconductor layer side.

The light emission intensity ratio approximates to 0 when Mg is doped into only the interlayer 31 at the concentration of $5 \times 10^{18}$ cm$^{-3}$ without the doping of Mg into the second active layer 32, as shown in FIG. 6. More specifically, calculation indicates that the light emission intensity of the first active layer 30 serving as the active layer disposed at the n-type semiconductor layer 51 side approximates to 0. In more detail, the effect of periodic gain structure cannot be achieved when no Mg is doped into the second active layer 32. Furthermore, as shown in FIG. 5, the doping concentration of Mg doped into the second active layer 32 ranges from $1\times10^{18}$ cm$^{-3}$ to $1\times10^{19}$ cm$^{-3}$, and the doping concentration of Mg doped into the interlayer 31 is $5.5\times10^{18}$ cm$^{-3}$. These facts indicate that Mg as the p-type impurity doped into the second active layer 32 needs to have a concentration ranging from 0.2 times to twice as high as a concentration of Mg doped into the interlayer 31.

The findings from the conducted experiment will be summarized as follows. It is generally desirable that light emission intensities of the first and second active layers 30 and 32 should be even (the light emission intensity ratio is 0.5) in the periodic gain structure. However, as shown in FIG. 4, when the doping concentration of Mg doped into the interlayer 31 becomes exceedingly higher than $5.5\times10^{18}$ cm$^{-3}$, the crystal quality of the second active layer 32 is reduced with the result that the light emission intensity of the device is also reduced.

As a result, the doping concentration of Mg doped into the interlayer 31 is determined to be not more than $5.5\times10^{18}$ cm$^{-3}$ in the nitride semiconductor light-emitting device with the periodic gain active layers. This is a concentration at which carriers can evenly be injected into the first and second active layers 30 and 32 when the nitride semiconductor light-emitting device is formed into the periodic gain structure that the first and second active layers 30 and 32 have the same light emission wavelength. In this periodic gain structure, carriers are not evenly injected into the first and second active layers 30 and 32 both of which have generally expected light emission intensities respectively. Still furthermore, the light emission intensity of the second active layer 32 is larger than the light emission intensity of the first active layer 30 in this nitride semiconductor light-emitting device. In other words, the device employs the periodic gain structure in which an amount of carriers injected into the second active layer 32 is larger than an amount of carriers injected into the first active layer 30. Consequently, the device can achieve an effect of the periodic gain structure while suppressing reduction in the light emission intensities of the first and second active layers 30 and 32.

Figure 7:
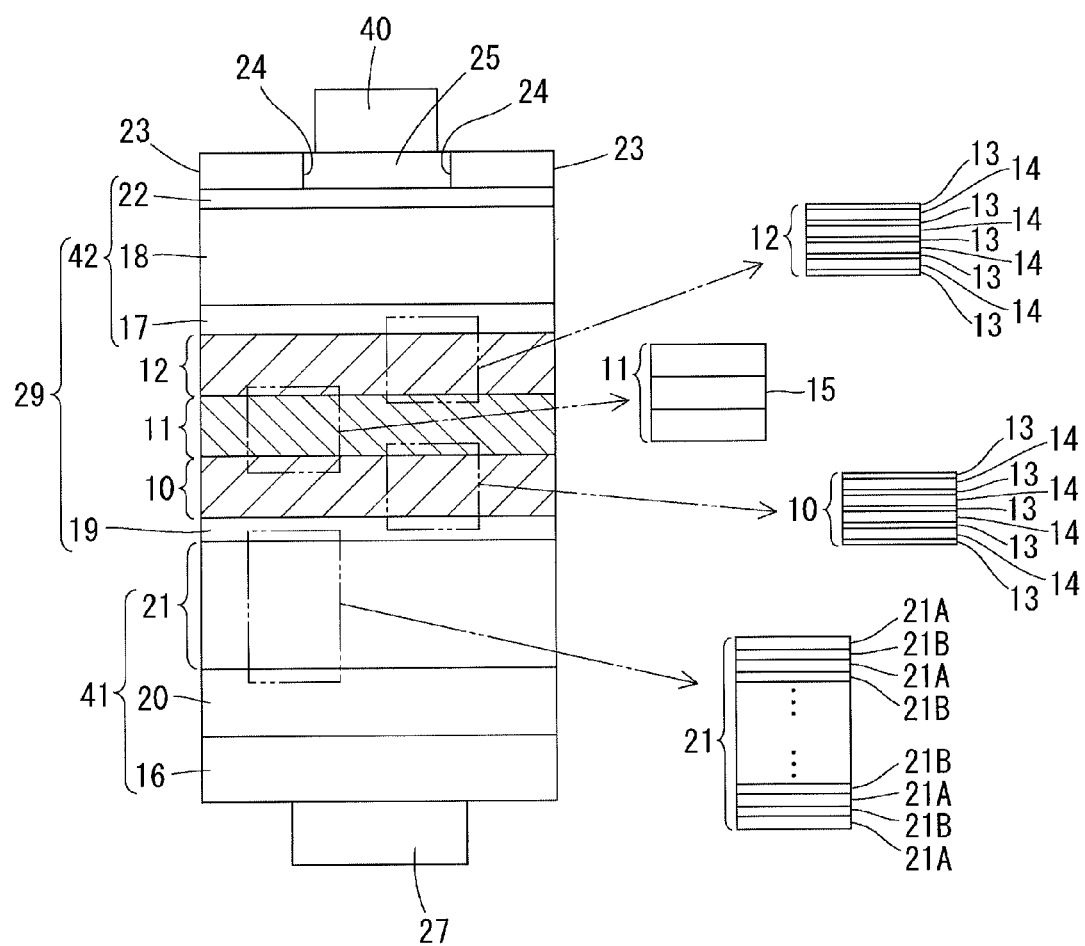
FIG. 7 is a schematic diagram showing layer structures of nitride semiconductor light-emitting devices with periodic gain active layers, of a second embodiment.

A second embodiment will now be described with reference to FIG. 7. The second embodiment is based on the findings obtained from the experiment conducted using the nitride semiconductor light-emitting devices of the first embodiment and comparative examples 1 to 4.

The nitride semiconductor light-emitting device with the periodic gain active layers, according to the second embodiment is provided with a periodic gain structure and a dielectric multilayer reflecting mirror layer 40. The periodic gain structure has an n-type GaN substrate 16, a nitride semiconductor multilayer reflecting mirror layer 21, a first active layer 10, an interlayer 11 and a second active layer 12. An n-type GaN self-supporting substrate fabricated by hydride vapor phase epitaxy (HVPE) is used as the n-type GaN substrate 16. Nitride semiconductor layers are formed on a surface of the n-type GaN substrate 16 by MOCVD.

Firstly, the n-type GaN substrate 16 is set into a reacting furnace of the MOCVD machine with a Ga polar face serving as a surface (the surface will hereinafter be an upper side in FIG. 7). A temperature in the reacting furnace is increased while hydrogen ($H_2$) and ammonia ($NH_3$) are supplied to the reacting furnace, whereby thermal cleaning is applied to the surface of the n-type GaN substrate 16.

The temperature in the reacting furnace is then adjusted so that the temperature of the n-type GaN substrate 16 is set to 1050° C. $H_2$ as a carrier gas, trimethylgalium (TMGa) and $NH_3$ as a material, and silane ($SiH_4$) as an n-type impurity material gas are supplied into the reacting furnace. As a result, an n-type GaN underlayer 20 having a thickness of about 500 nm is formed on the surface of the n-type GaN substrate 16. A doping concentration of Silicon (Si) as an n-type impurity doped into the n-type GaN underlayer 20 is set to $2\times10^{18}$ cm$^{-3}$.

Next, the nitride semiconductor multilayer film reflector layer 21 is formed on the surface of the n-type GaN underlayer 20 in the following method. The nitride semiconductor multilayer reflecting mirror layer 21 has a reflection center wavelength of about 410 nm and a reflectance at the reflection center wavelength, which is not less than 99%.

Firstly, the temperature in the reacting furnace is adjusted so that the temperature of the n-type GaN substrate 16 is set to 800° C. $N_2$ (nitrogen) as a carrier gas, trimethylaluminum (TMAl), TMIn (trimethylindium) and $NH_3$ as a material, and silane ($SiH_4$) as an n-type impurity material gas are supplied into the reacting furnace. As a result, an n-type AlInN layer 21A having a thickness of about 50 nm is formed on the surface of the n-type GaN underlayer 20. The n-type AlInN layer 21A comprises indium (In) whose composition value is set to about 0.17 in order to be lattice-matched to an n-type GaN layer 21B which will be described later. A doping concentration of Si as the n-type impurity doped into the n-type AlInN layer 21A is set to $1\times10^{19}$ cm$^{-3}$. The temperature in the reacting furnace is adjusted so that the temperature of the n-type GaN substrate 16 is set to 1000° C. $N_2$ as a carrier gas, TMGa and $NH_3$ as a material, and $SiH_4$ are supplied into the reacting furnace. The n-type GaN layer 21B is formed on the n-type AlInN layer 21A so as to have a thickness of about 40 nm. A doping concentration of Si as the n-type impurity doped into the n-type GaN layer 21B is set to $7\times10^{18}$ cm$^{-3}$. The n-type AlInN layers 21A and the n-type GaN layers 21B are stacked alternately. On the surface of the n-type GaN underlayer 20 are stacked 40.5 pairs of the n-type AlInN layers 21A and the n-type GaN layers 21B, which stacked pairs are formed into the nitride semiconductor multilayer film reflector layer 21. The n-type GaN substrate 16, the n-type GaN underlayer 20 and the nitride semiconductor multilayer reflecting mirror layer 21 serve as an n-type semiconductor layer 41.

The AlInN layer 21A and the GaN layer 21B both constituting the nitride semiconductor multilayer reflecting mirror layer 21 are formed into n-type layers, so that the nitride semiconductor light-emitting device of the second embodiment employs a structure which allows current injection in a longitudinal direction of the resonator structure. However, the nitride semiconductor light-emitting device may employ an intracavity structure in which the AlInN layer 21A and the GaN layer 21B are formed into undoped layers without the doping of n-type and p-type impurities, so that current is injected in a transverse direction of the resonator structure.

Next, a two-wavelength resonator 29 is formed on the surface of the nitride semiconductor multilayer reflecting mirror layer 21 in the following method. The two-wavelength resonator 29 includes the first and second active layers 10 and 12 both having the same light emission wavelength of 410 nm. Firstly, an n-type GaN layer 19 is formed on the surface of the nitride semiconductor multilayer film reflector layer 21 so as to have a thickness of about 70 nm. Si as an n-type impurity is doped into the n-type GaN layer 19 at the concentration of $2\times10^{18}$ cm$^{-3}$.

Next, the temperature in the reacting furnace is adjusted so that the temperature of the n-type GaN substrate 16 is set to 780° C. Molecular nitrogen ($N_2$) as the carrier gas, TMGa, TMIn and $NH_3$ as a material are supplied into the reacting furnace, so that a GaInN quantum well layer 13 having a thickness of 3 nm is formed. Thereafter, supply of only TMIn is stopped and a GaN barrier layer 14 having a thickness of 6 nm is formed. The GaInN quantum well layer 13 and the GaN barrier layer 14 are paired and 4.5 pairs of the layers 13 and 14 are stacked to be formed into a first active layer 10 (a GaInN quintuple quantum well active layer). A GaN interlayer 11 with a thickness of about 50 nm, serving as an intermediate layer is formed on a surface of the first active layer 10. In this case, Mg as the p-type impurity is doped into a 20-nm section 15 with a center corresponding to a thicknesswise central part of the GaN interlayer 11 and has a concentration of $2.5 \times 10^{18}$ cm$^{-3}$ which value is not more than $5 \times 10^{18}$ cm$^{-3}$. Cyclopentadienylmagnesium (CP2Mg) as a p-type impurity material gas is used for the doping of Mg as the p-type impurity. A second active layer 12 (a GaInN quintuple quantum well active layer) having the same layer structure as the first active layer 10 is formed on the surface of the GaN interlayer 11.

Thus, the thickness of the GaN interlayer 11 is set to 50 nm in the device of the second embodiment with the result that the first and second active layers 10 and 12 can be disposed so that the layer-thicknesswise centers of the first and second active layers 10 and 12 correspond to a peak intensity position of light existing by a laser operation in the resonator. Furthermore, Mg as the p-type impurity doped into the 20-nm section 15 with the center corresponding to the thicknesswise central part of the GaN interlayer 11 has the concentration set to $2.5 \times 10^{18}$ cm$^{-3}$ which value is not more than $5 \times 10^{18}$ cm$^{-3}$. As a result, an amount of carriers injected into the second active layer 12 can be rendered larger than an amount of carriers injected into the first active layer 10.

Next, the temperature in the reacting furnace is adjusted so that the temperature of the n-type GaN substrate 16 is set to 1000° C. The carrier gas is changed from $N_2$ to $H_2$ and TMGa, TMAl, CP2Mg and $NH_3$ are supplied into the reacting furnace. Thus, a p-type AlGaN layer 17 with a thickness of 20 nm and a p-type GaN layer 18 with a thickness of about 100 nm are formed in turn. Mg as the p-type impurity is doped into each of the p-type AlGaN layer 17 and the p-type GaN layer 18 at the concentration of $2 \times 10^{19}$ cm$^{-3}$.

Next, a p-type GaN contact layer 22 with a thickness of 10 nm is formed on a surface of the p-type GaN layer 18. Mg as the p-type impurity is doped into the p-type GaN contact layer 22 at the concentration of $2 \times 10^{20}$ cm$^{-3}$. The p-type AlGaN layer 17, the p-type GaN layer 18 and the p-type GaN contact layer 22 serve as a p-type semiconductor layer 42. Thus, the two-wavelength resonator 29 with a total layer thickness of 340 nm is formed on the surface of the nitride semiconductor multilayer film reflector layer 21.

A p-side electrode and an n-side electrode for execution of current injection into the nitride semiconductor light-emitting device will be formed by the following method. Firstly, an $SiO_2$ film 23 with a thickness of 20 nm is formed on the surface of the p-type GaN contact layer 22. An opening 24 with a diameter of 10 nm is formed on a central part of the $SiO_2$ film 23 by photolithography and dry etching, so that the p-type GaN contact layer 22 is exposed therethrough. An indium tin oxide (ITO) transparent electrode 25 with a thickness of 20 nm is formed on the surface of the p-type GaN contact layer 22 which is exposed at the bottom of the opening 24. The ITO transparent electrode 25 serves as a p-side contact electrode and as a current constrictor. An outer periphery (not shown) is then formed which is brought into contact with an outer periphery of the ITO transparent electrode 25. A titanium (Ti)/gold (Au) electrode (not shown) having a pad for wire bonding is also formed, with the result that the p-side electrode is formed. The nitride semiconductor multilayer reflecting mirror layer 21 and the two-wavelength resonator 29 are partially dry-etched by photolithography for the purpose of element isolation. Next, eight pairs of $SiO_2$ layers and $ZrO_2$ layers are stacked on a surface of the ITO transparent electrode 25 to be formed into the dielectric multiplayer reflecting mirror layer 40. Each one pair of the $SiO_2$ layer and the $ZrO_2$ layer has a reflection center wavelength of 410 nm. The resonator structure is thus completed.

Next, Ti, Al, Ti and Au are stacked on the rear surface of the n-type GaN substrate 16 (the rear surface is at the lower side in FIG. 7) thereby to be formed into an electrode 27. As a result, the device according to the second embodiment is completed. The device is current-injectable. Since the device has a periodic gain structure, the device can reduce a threshold current value as compared with a nitride semiconductor light-emitting device with a single active layer and can increase a differential quantum efficiency. As a result, the characteristics of the device can be improved.

In the device having the above-described structure, the second active layer 12 as the active layer disposed at the p-type semiconductor layer 42 side has a larger light emission intensity than the first active layer 10 as the active layer disposed at the n-type semiconductor layer 41 side. In other words, the doping concentration of Mg as the p-type impurity doped into the interlayer 11 can be rendered lower. Consequently, since the reduction in the crystal quality of the second active layer 12 is suppressed, the device can suppress reduction in the light emission intensity. Accordingly, the device can successfully emit light.

Furthermore, the device includes the n-type semiconductor layer 41, the p-type semiconductor layer 42 and the resonator (the two-wavelength resonator 29). The device also includes a plurality of active layers (the first active layer 10 and the second active layer 12) disposed at a peak intensity position of light existing in the resonator (the two-wavelength resonator 29) between the n-type semiconductor layer 41 and the p-type semiconductor layer 42, and the interlayers 11 disposed between the active layers (the first and second active layers 10 and 12). Furthermore, an amount of positive holes and electrons injected into the active layer (the second active layer 12) disposed at the p-type semiconductor layer 42 side is larger than an amount of positive holes and electrons injected into the active layer (the first active layer 10) disposed at the n-type semiconductor layer 41 side. Consequently, the device can maintain the doping concentration of Mg as the p-type impurity doped into the interlayer 11 at a low level. This can suppress reduction in the crystal quality of the active layer (the second active layer 12) disposed at the p-type semiconductor layer 42 side.

Furthermore, Mg as the p-type impurity doped into the interlayer 11 has a concentration of not more than $5 \times 10^{18}$ cm$^{-3}$. Consequently, the device can suppress reduction in the light emission intensity relative to the current density.

Furthermore, the device is provided with two active layers (the first and second active layers 10 and 12), which have the same emission wavelength. Consequently, the device can successfully oscillate by gains of the plural active layers (the first and second active layers 10 and 12).

The first and second embodiments described above with reference to the drawings should not be restrictive but may be modified as follows.

(1) Although Mg is used as the p-type impurity in the first and second embodiments, Zn, Be, Ca, Sr, Ba or the like may be used as the p-type impurity instead.

(2) Although Si is used as the n-type impurity in the first and second embodiments, Ge or the like may be used as the n-type impurity instead.

(3) Although crystal is grown on the surface of the Ga polar face in the first and second embodiments, the crystal may be grown on an N polar surface or a semipolar surface instead.

(4) Although 4.5 pairs of the quantum well layer and the barrier layer are stacked to be formed into the first and second active layers respectively in the second embodiment, the number of pairs may be smaller or larger than 4.5 instead.

(5) Although the light emission wavelength of the first and second active layers is set to 410 nm in the second embodiment, the emission wavelength may be longer or shorter than 410 nm instead.

(6) Although the thickness of the interlayer is set to about 50 nm in the first and second embodiments, the thickness of the interlayer may be larger or smaller than 50 nm along with the emission wavelength instead.

We claim:

1. A nitride semiconductor light-emitting device with periodic gain active layers, which includes an n-type semiconductor layer, a p-type semiconductor layer and a resonator, the device comprising:

two active layers disposed between the n-type and p-type semiconductor layers so as to correspond to a peak intensity position of light existing in the resonator, each active layer being formed by alternately stacking a plurality of quantum well layers each formed of GaInN and a plurality of barrier layers each formed of GaN one upon another, the active layers having respective light emission wavelengths equal to each other; and at least one interlayer disposed between the active layers so as to be adjacent to the active layers, the interlayer having a larger thickness than the barrier layers and being formed of GaN, wherein Mg as a p-type impurity doped into the interlayer has a concentration of not more than $5 \times 10^{18}$ cm$^{-3}$, wherein the active layer disposed at the p-type semiconductor layer side has a larger light emission intensity than the active layer disposed at the n-type semiconductor layer side; and wherein Mg as a p-type impurity doped into the active layer disposed at the p-type semiconductor layer side has a concentration ranging from 0.2 times to twice as high as a concentration of the Mg doped into the interlayer.

2. The device according to claim 1, wherein the interlayer is thicker than the active layers.

3. The device according to claim 1, wherein the interlayer includes a thicknesswise central part having a section into which Mg as a p-type impurity is doped.

4. A nitride semiconductor light-emitting device with periodic gain active layers, which includes an n-type semiconductor layer, a p-type semiconductor layer and a resonator, the device comprising:

two active layers disposed between the n-type and p-type semiconductor layers so as to correspond to a peak intensity position of light existing in the resonator, each active layer being formed by alternately stacking a plurality of quantum well layers each formed of GaInN and a plurality of barrier layers each formed of GaN one upon another, the active layers having respective light emission wavelengths equal to each other; and at least one interlayer disposed between the active layers so as to be adjacent to the active layers, the interlayer having a larger thickness than the barrier layers and being formed of GaN, wherein Mg as a p-type impurity doped into the interlayer has a concentration of not more than $5 \times 10^{18}$ cm$^{-3}$, wherein an amount of positive holes and electrons injected into the active layer disposed at the p-type semiconductor layer side is larger than an amount of positive holes and electrons injected into the active layer disposed at the n-type semiconductor layer side; and wherein Mg as a p-type impurity doped into the active layer disposed at the p-type semiconductor layer side has a concentration ranging from 0.2 times to twice as high as a concentration of the Mg doped into the interlayer.

5. The device according to claim 4, wherein the interlayer is thicker than the active layers.

6. The device according to claim 4, wherein the interlayer includes a thicknesswise central part having a section into which Mg as a p-type impurity is doped.

* * * * *